US007538567B2

(12) United States Patent
Lu et al.

(10) Patent No.: US 7,538,567 B2
(45) Date of Patent: May 26, 2009

(54) PROBE CARD WITH BALANCED LATERAL FORCE

(75) Inventors: Shaoning Lu, Monrovia, CA (US); Melvin Khoo, San Gabriel, CA (US); Nim Tea, Orange, CA (US)

(73) Assignee: Touchdown Technologies, Inc., Baldwin Park, CA (US)

( * ) Notice: Subject to any disclaimer, the term of this patent is extended or adjusted under 35 U.S.C. 154(b) by 177 days.

(21) Appl. No.: 11/457,132

(22) Filed: Jul. 12, 2006

(65) Prior Publication Data

US 2008/0012594 A1    Jan. 17, 2008

(51) Int. Cl.
*G01R 31/02* (2006.01)
(52) U.S. Cl. ............... 324/758; 324/754; 324/761; 324/762
(58) Field of Classification Search .............. None
See application file for complete search history.

(56) References Cited

U.S. PATENT DOCUMENTS

| | | | |
|---|---|---|---|
| 5,416,429 A | 5/1995 | McQuade et al. | |
| 5,629,630 A | 5/1997 | Thompson et al. | |
| 5,751,157 A | 5/1998 | Kister | |
| 5,914,613 A | 6/1999 | Gleason et al. | |
| 5,923,178 A | 7/1999 | Higgins et al. | |
| 6,340,895 B1 | 1/2002 | Uher et al. | |
| 6,426,637 B1 | 7/2002 | Dang et al. | |
| 6,426,638 B1 | 7/2002 | Di Stefano | |
| 6,617,865 B2 | 9/2003 | Di Stefano | |
| 6,924,653 B2 | 8/2005 | Schaeffer et al. | |
| 2003/0214045 A1 | 11/2003 | Lahiri et al. | |
| 2003/0218244 A1 | 11/2003 | Lahiri et al. | |
| 2004/0036490 A1 | 2/2004 | Schaeffer et al. | |
| 2007/0057685 A1* | 3/2007 | Garabedian et al. ......... 324/756 |

OTHER PUBLICATIONS

International Search Report Dated Oct. 31, 2007.
Preliminary Report on Patentability dated Jan. 13, 2009.

* cited by examiner

*Primary Examiner*—Minh N Tang
(74) *Attorney, Agent, or Firm*—Manuel F. de la Cerra (57) ABSTRACT

A novel method and structure for counter-balancing a lateral force exerted by a probe card onto a device under test ("DUT") is disclosed. Many DUTs (particularly memory devices) are tested in parallel (i.e., many die at a time) and have unequal numbers of contact pads on top vs. bottom and/or right vs. left sides of the die. The probe card used to test the DUT would necessarily have an uneven distribution of probes that match the contact pads and, as a consequence, may exert a net lateral force on the DUT. By manipulating the individual characteristics of the individual probes, a probe card may be constructed that zeroes the lateral force. Characteristics such as the direction and stiffness of the individual probes can be varied to zero the net lateral force.

10 Claims, 13 Drawing Sheets

Top Array

Bottom Array

FIGURE 7

Top Array

Bottom Array

PROBE CARD WITH BALANCED LATERAL FORCE

1 FIELD OF THE INVENTION

The present invention relates to structures and methods which may be used in semiconductors and semiconductor wafer testing.

2 BACKGROUND OF THE INVENTION

Integrated circuits are made in a bulk parallel process by patterning and processing semiconductor wafers. Each wafer contains many identical copies of the same integrated circuit referred to as a "die." Semiconductor wafers must be tested before the die is cut into individual integrated circuits and packaged for sale. If defects are detected, the defective die can be culled before wasting resources packaging a defective part.

Figure 14A:
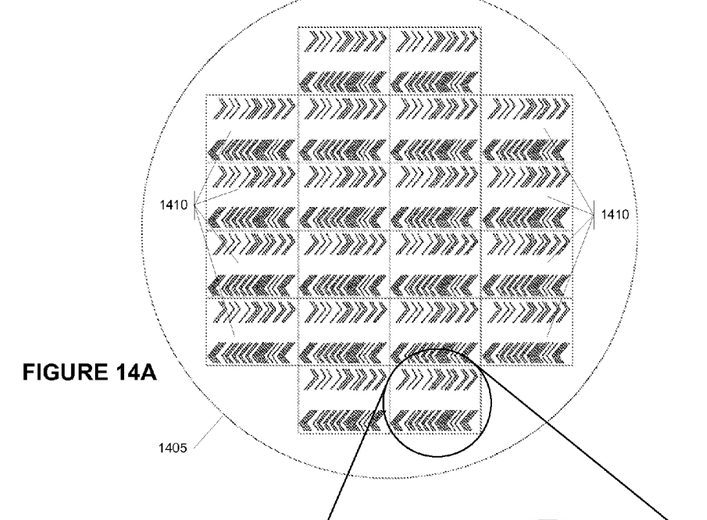
FIGS. 14A and 14B is a plan view of a probe card with twenty single die probe areas and a callout of a single die probe area with two arrays of individual probes.
Figure 14B:
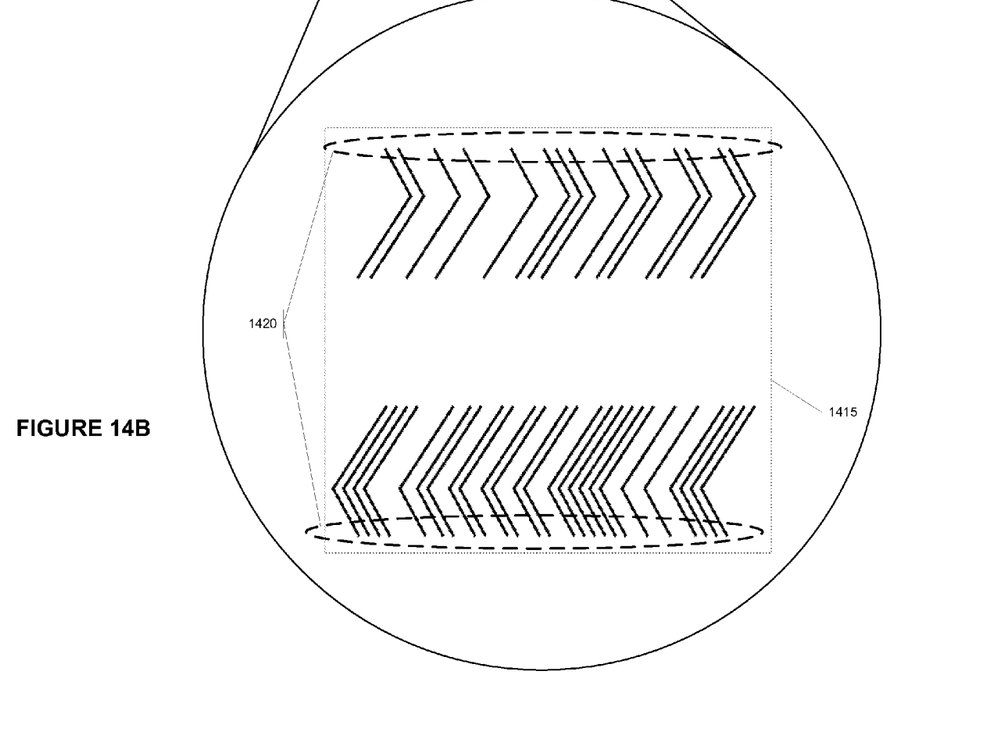

To test a wafer, a probe card is commonly used to come in contact with the surface of the wafer. The probe card generally contains three unique characteristics: (1) an XY array of individual probes that bend in the Z direction to allow contact with the die; (2) an electrical interface to connect the card to a circuit test apparatus; and (3) a rigid reference plane defined in such a way that the probe card can be accurately mounted in the same location on the wafer tester. FIG. 14A illustrates a probe card (1405) that contains twenty single die probe areas (1410) allowing it to test twenty die simultaneously. FIG. 14B is a callout figure of the probe card (1405) and shows a single die probe area (1415) that contains two arrays of several individual probes (1420). The particular configuration of the probes depicted in FIG. 14B would correspond to the placement of the contact pads on the integrated circuit die under test (also known as the device under test or "DUT").

Figure 15:
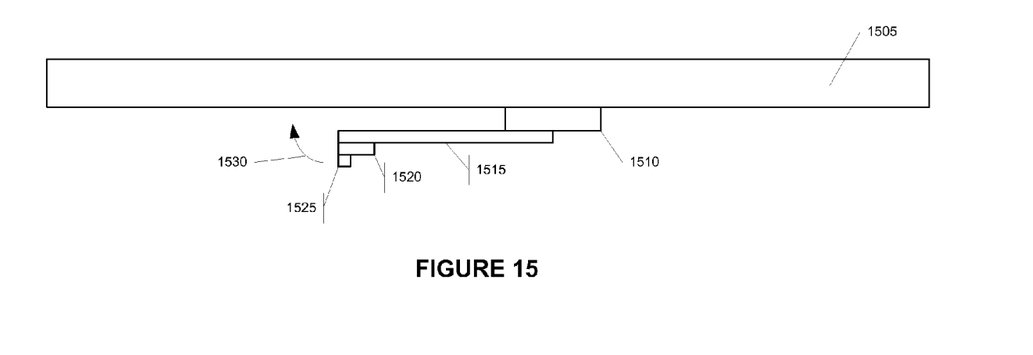
FIG. 15 is a cross-sectional view of an individual probe.

FIG. 15 depicts a cross sectional view of a possible structure for an individual probe. The probe may comprise a substrate (1505), probe base (1510), spring element (1515), tip supporting structure (1520), and a probe tip (1525). When the probe card is brought in contact with the die, the Z-direction bending (shown as arrow 1530) allows for an electrical contact between the probe tip (1525) and the contact pad of the DUT. Other probe structures are possible including the "Torsion Spring Probe Contactor Design" disclosed in U.S. patent application Ser. No. 11/194,801 commonly owned by the present applicant, the contents of which are incorporated herein by reference. The torsion spring contactors described therein may be manufactured using the lithography techniques described in U.S. patent application Ser. Nos. 11/019,912 and 11/102,982, both commonly owned by the present applicant and hereby also incorporated by reference.

The probe card ultimately provides an electrical interface that allows a circuit test apparatus to be temporarily connected to the individual DUT. This method of testing is extremely efficient because many die can be tested at the same time. To drive this efficiency even higher, probe card manufacturers are making larger probe cards with an ever-increasing numbers of DUTs and thus probes.

Figure 16:
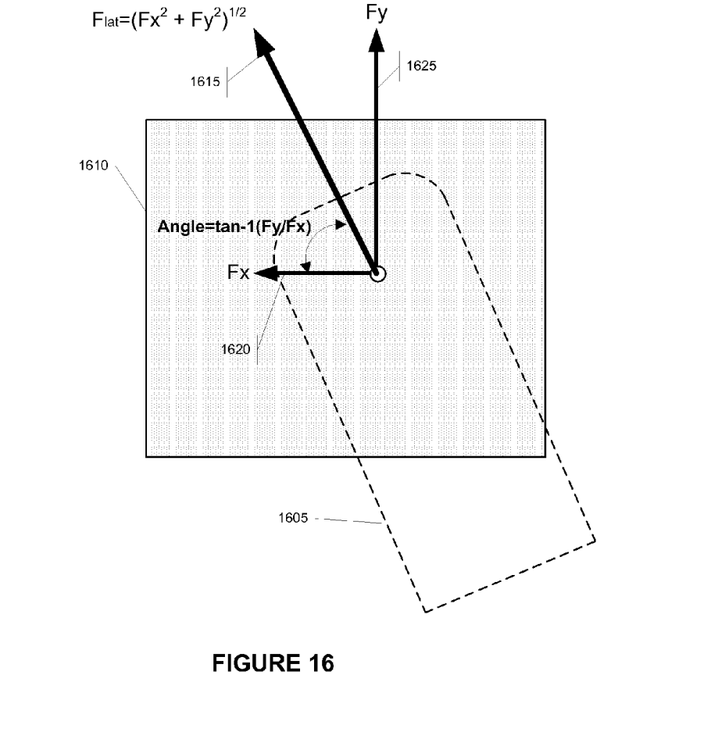
FIG. 16 illustrates the lateral forces that an individual probe exerts on the contact pad of a DUT.

As the probe comes into contact with the contact pads of the DUT, the probe exerts a force on the DUT in the Z-direction (i.e., perpendicular to the plane of the DUT) and a smaller but still significant force in the lateral direction (i.e., parallel to the plane of the DUT). FIG. 16 illustrates the forces that a probe (1605) may exert on a contact pad (1610) of the DUT. The probe (1605) exerts a lateral force $F_{lat}$ in the direction of vector 1615, which has a component $F_x$ in the X direction as shown by vector 1620 and a component $F_y$ in the Y direction as shown by arrow 1625. The magnitude of $F_{lat}=(F_x^2+F_y^2)^{1/2}$ and the angular direction is $\tan^{-1} F_y/F_x$.

Figure 17:
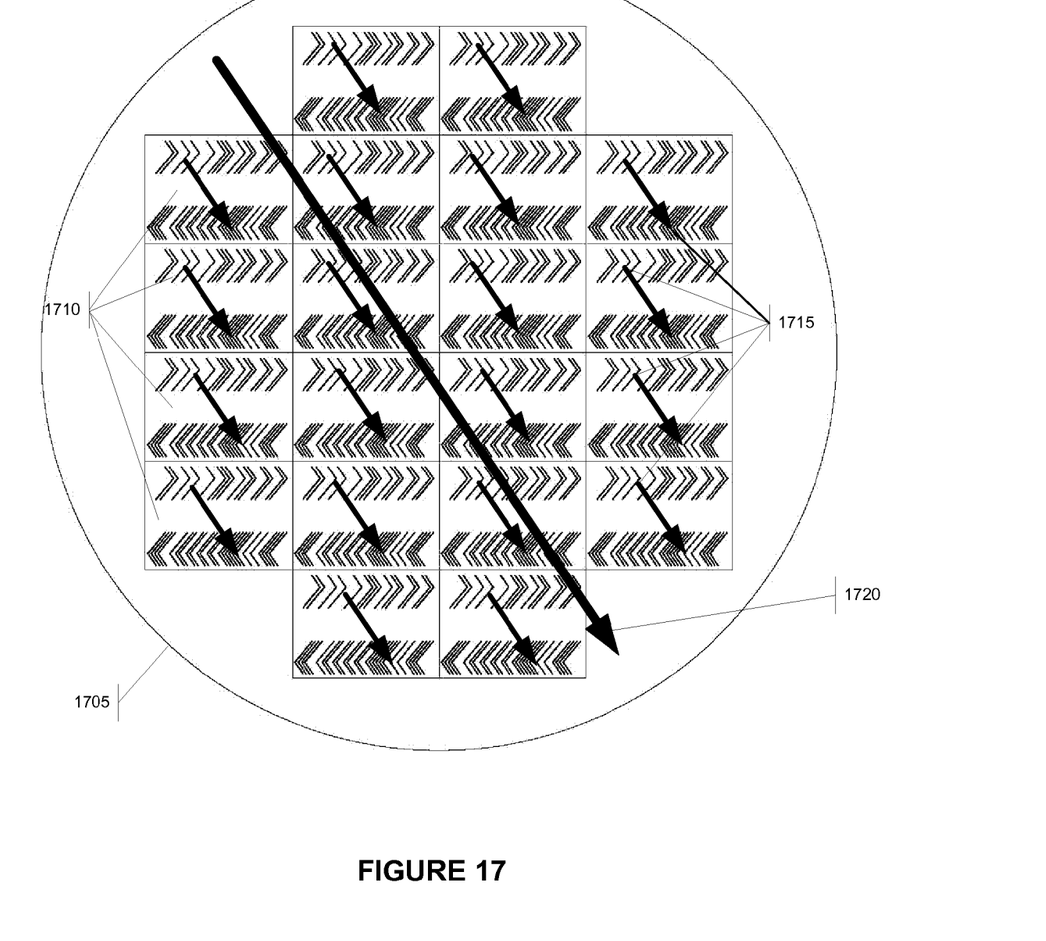
FIG. 17 is a plan view of a probe card with twenty single die probe areas, the lateral force exerted from each single die area and the net force exerted by the probe card.

Many semiconductor devices (particularly memory devices) are tested in parallel (i.e. many die at a time as shown in FIG. 14A) and have unequal numbers of contact pads on top vs. bottom and/or right vs. left sides of the die. The probe card used to test such a DUT would necessarily have an uneven distribution of probes that match the contact pads. This is the case shown in FIG. 14B, where the top array of probes has fifteen individual probes, while the bottom array contains twenty-five probes. As a consequence, the individual probes within a single die probe area exert a force that is not balanced, resulting in each individual die probe area experiencing a net lateral force. In FIG. 17, a probe card (1705) is shown with the same single die probe area (1710) configuration as in FIG. 14B. Because of the imbalance within one of these areas, a vector 1715 develops within each area. These vectors form a net lateral force vector 1720 for the entire probe card.

As the semiconductor industry has continued to decrease the size of integrated circuits (and consequently the die size), both the contact pad size and their spacing have decreased accordingly. Thus, new manufacturing methods have utilized photolithographic and micro-machining techniques to very accurately position the probes within the needed tolerances and to pack more probes onto a single card. Current state of the art semiconductor manufacturing routinely produces contact pad sizes of 80 um with inter-pad spacing on a 100 um pitch. A current probe card may have as many as 5,000 or more individual probes that engage the contact pads of the DUTs. Consequently, the net lateral force over these probe cards has also increased significantly. The increase in lateral force places the probe card and the DUT under stress; this can compromise the efficacy of the probe testing and may damage the DUT.

Currently available techniques to address the net lateral force include orienting the probes in roughly the four orthogonal directions, such that the lateral forces could be diminished. The probe card may also include support screws and stiffener elements to minimize the mechanical effect of net lateral force on the probe card. In addition, the probe card may be moved vertically and laterally to ameliorate the lateral forces exerted by the probe onto the DUT. Finally, the support structure for the wafer (also known as the chuck) may be engineered to be extremely rigid laterally.

Each of these techniques has shortcomings. For example, the rough orientation of the probes often cannot work in probe card layouts because contact pads for the DUT do not lend themselves to a completely orthogonal layout. Adding rigidity, either to the probe card or the chuck, adds expense to the probe testing process. More importantly, these techniques do not address the fundamental problem; rather they are band aid solutions that become less and less effective as the number of probes on a card continues to explode.

What is needed, therefore, is a method and apparatus that minimizes or neutralizes the root cause of the net lateral force.

3 SUMMARY OF THE INVENTION

The object of the present invention is to make zero (or near zero) the net lateral force exerted by a single die probe area and also that exerted by a probe card comprised of several single die probe areas. When a DUT has an uneven distribution of contact pads, the probe card used to test the DUT may also have an uneven distribution of probes which can cause a net lateral force to be exerted on the DUT. By manipulating the individual characteristics of the individual probes, a probe
} card may be constructed which zeroes the lateral force. For example, the direction of the individual probes may be altered to counter-balance the lateral force. Also, varying the stiffness of the individual probes of the probe can be used to counter-balance the lateral force. Any combination of these characteristics can be varied depending on the particular probe design.

In an embodiment the net lateral force is zeroed (or near zeroed) within the probe area for a single die. Because the probe card often tests several identical die simultaneously, the probe card may be comprised of several of these areas, each of which is identical to each other. Zeroing the lateral force within the probe area of a single die would zero the net lateral force across the entire probe card. Thus, the probe card can be scaled up to test any number of die without exerting a net lateral force.

5 DETAILED DESCRIPTION OF THE INVENTION

Figure 1:
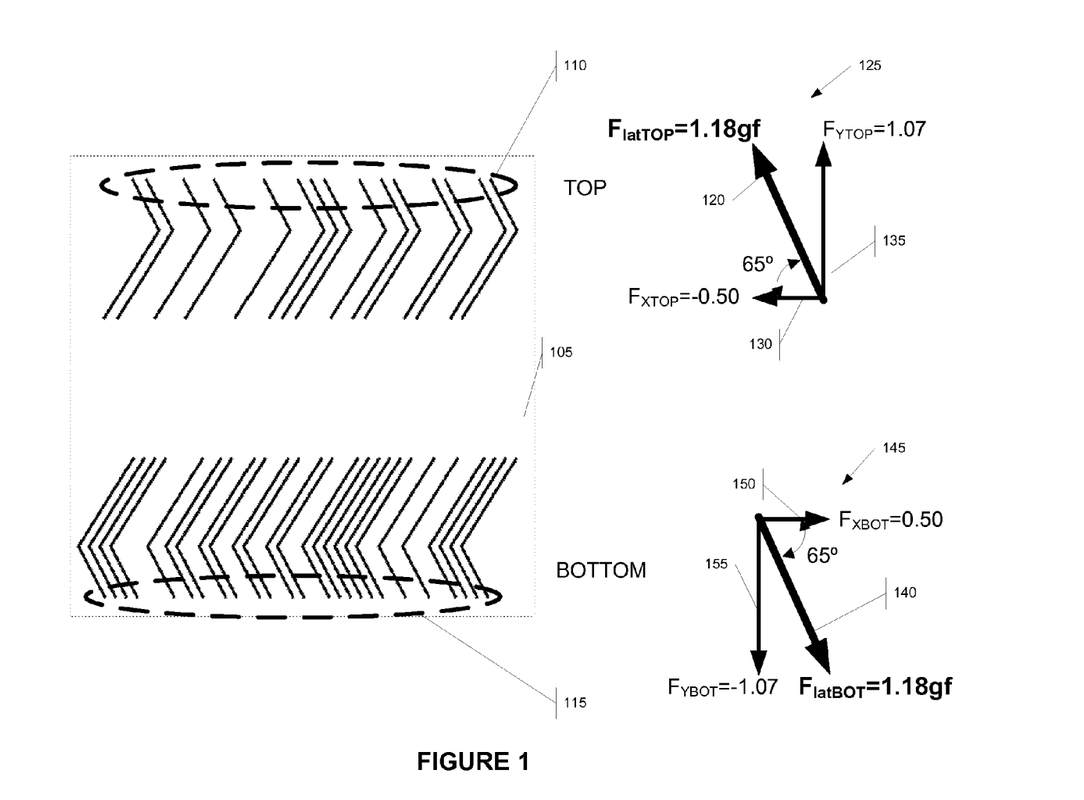
FIG. 1 is a plan view of a single die probe area of a probe card and an illustration of the net lateral force exerted by the several probes on the top array and the bottom array in the single die probe area.

What is described below is a novel method and structure for counter-balancing a lateral force exerted by a probe card on a DUT or DUTs on a wafer. Because many DUTs have unequal numbers of contact pads on top vs. bottom and/or right vs. left sides of the die, this non-uniformity can result in the probe card exerting a net lateral force. FIG. 1 shows an example of a of a single die probe area (105) of a probe card that contains a non-uniform distribution of probes. Specifically, the top array of probes (110) is comprised of fifteen individual probes and a bottom array of probes (115) is comprised of twenty-five individual probes. Each of the probes in the top array (110) exerts a lateral force ($F_{latTOP}$ shown as part 120) equal to 1.18 gram force (gf) as shown in the vector diagram 125, which has an X-component ($F_{XTOP}$ shown as part 130) equal to −0.50 gf and a Y-component ($F_{YTOP}$ shown as part 135) equal to 1.07 gf. Each probe in the bottom array (115) exerts a lateral force ($F_{latBOT}$ shown as part 140) equal to 1.18 gf as shown in the vector diagram 145, which has an X-component ($F_{XBOT}$ shown as part 150) equal to 0.50 gf and a Y-component ($F_{YBOT}$ shown as part 155) equal to −1.07 gf. For the sake of simplicity, the probe configuration shown in FIG. 1 results in a $F_{latTOP}$ for each individual top probe that is equal in magnitude but opposite in direction as the $F_{latBOT}$ for each individual bottom probe (i.e., the X-components sum to zero and the Y-components sum to zero). However, because there are ten more probes in the bottom array (115) than in the top array (105), the probe card will exert a net lateral force, illustrated in FIG. 2. The net lateral force ($F_{lat}$ shown as part 205) is equal to 11.80 gf, which is simply the $F_{lat}$ of a single probe (i.e., 1.18 gf, see part 140) multiplied by the number of extra probes in the bottom array (i.e., ten). Likewise the X-component (210) of the net $F_{lat}$ is ten-fold of the Fx of a single probe (i.e., 0.5 gf, see part 150) and the Y-component (215) of the net $F_{lat}$ is ten-fold of the Fy of a single probe (i.e., 1.07 gf, see part 155).

Figure 2:
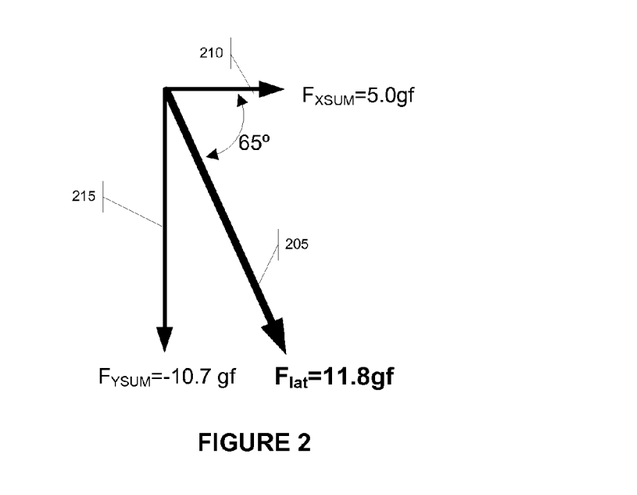
FIG. 2 presents the net lateral force, and its X and Y components, exerted by the several probes in FIG. 1.

While the example discussed with reference to FIGS. 1 and 2 illustrates a top and bottom array, it would be apparent to one skilled in the art that, depending on the rotation of the single die probe area (or the probe card), the arrays may be left and right instead of top and bottom. It is also possible that the probes may no be orthogonal at all.

Figure 3:
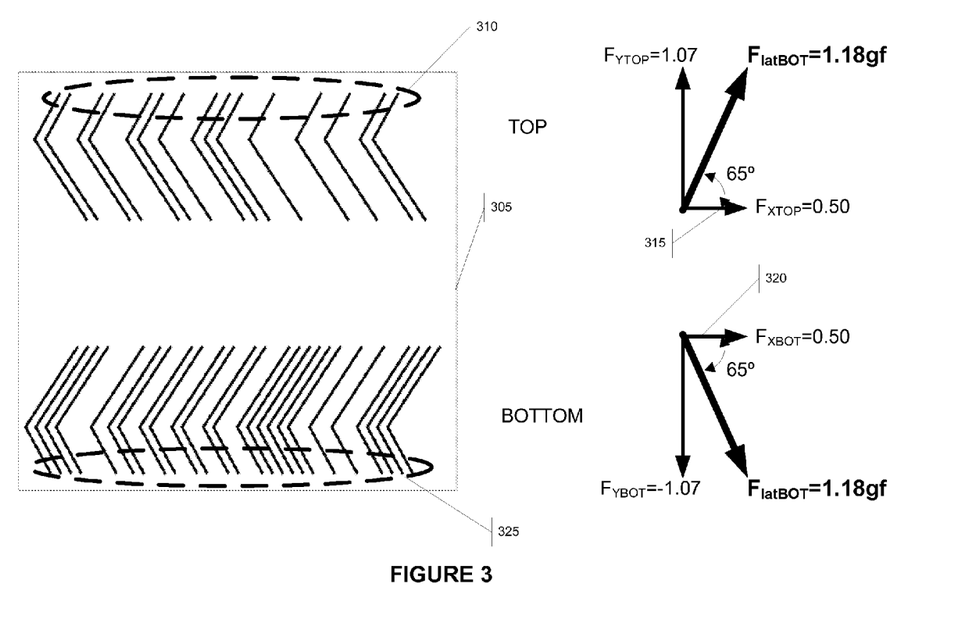
FIG. 3 is a plan view of a single die probe area of a probe card where in the X component of the lateral force for the individual probes are constructive, and an illustration of the net lateral force exerted by the several probes on the top array and the bottom array in the single die probe area.
Figure 4:
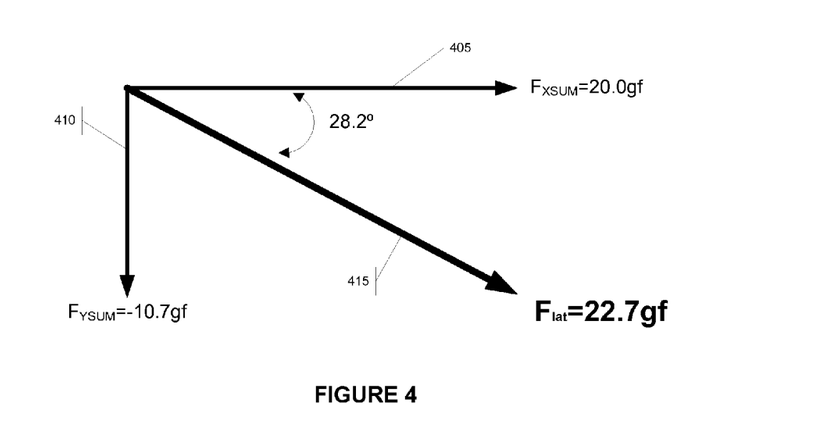
FIG. 4 presents the net lateral force, and its X and Y components, exerted by the several probes in FIG. 3.

FIG. 3 illustrates another single die probe area (305) that is similar to the single die probe area (105) shown in FIG. 1, except that the top array of probes (310) has an X-component ($F_{XTOP}$ shown as part 315) that is in the same direction as the X-component ($F_{XBOT}$ shown as part 320) of the bottom array of probes (325). Because the X-components of both the top and bottom arrays are in the same direction, the probe card will exert a net lateral force that has an X-component that is simply the sum of each of the X-components of the individual probes (i.e., 0.50 gf×40 probes=20.0 gf). The Y-component of the net force will be the same as that in FIG. 1 and is equal to 10.70 gf. The resultant net force vector is shown in FIG. 4. With a net X-component ($F_{XSUM}$ shown as part 405) equal to 20.0 gf and a Y-component ($F_{YSUM}$ shown as part 410) equal to 10.7 gf, the net lateral force ($F_{lat}$ shown as part 415) is equal to 22.7 gf, and has a direction of 28.2°.

As is shown in FIGS. 1 and 3, the net lateral force depends on the orientation of the various individual probes. While the previous examples illustrate only two probe directions within a single die probe area, it would be apparent to one skilled in the art that a single die probe area may have several probe directions. Also in FIGS. 1 and 3, the lateral force for each individual probe was uniform because the structure of each individual probe was identical; this however may not be the case because some probes may be more or less stiff, exerting a varying magnitude of force. Regardless of the number of probe directions and their individual magnitudes, the resultant net lateral force is found by simple vector addition (i.e., summing the X and Y components of the force exerted by each individual probe, from which the magnitude and direction for $F_{lat}$ can be determined).

When a probe card exerts a net lateral force, it can cause several problems with the testing efficiency. For example, the lateral force may damage the DUT/wafer by imparting additional stresses. To combat this, conventional techniques dictate that the probe card and/or the wafer chuck be made stiffer to accommodate the lateral force; this, however, increases cost and does not address the root problem of the lateral force.

Another problem caused by net lateral force is the variation of scrub marks on the DUT contact pad. By way of background, as an individual probe travels to make contact with the DUT contact pad (this event is called a touchdown), the probe tip scrubs the contact pad, which perfects an electrical contact with the DUT such that testing can commence. In fact, the DUT contact pads which are typically aluminum are often coated with a thin layer of aluminum oxide, or other protective coating, and the probe tip must cut through the coating to perfect the electrical connection. DUT manufactures prefer that the scrub marks be uniform across the entire wafer because this would indicate that each probe is making approximately the same ohmic electrical connection with the DUT. Conversely, non-uniform scrub marks could result in certain probe tips not perfecting a good electrical contact (for example, the tip may not even cut through the coating), which could cause false negatives during testing. False negatives are costly and reduce production yield.

Figure 5A:
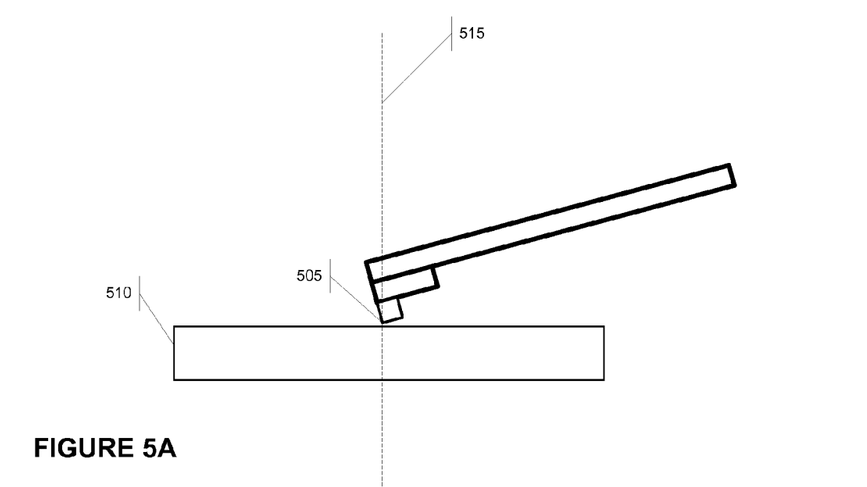
FIGS. 5A-5C are cross-sectional views of a probe as it engages the contact pad of a DUT.
Figure 5B:
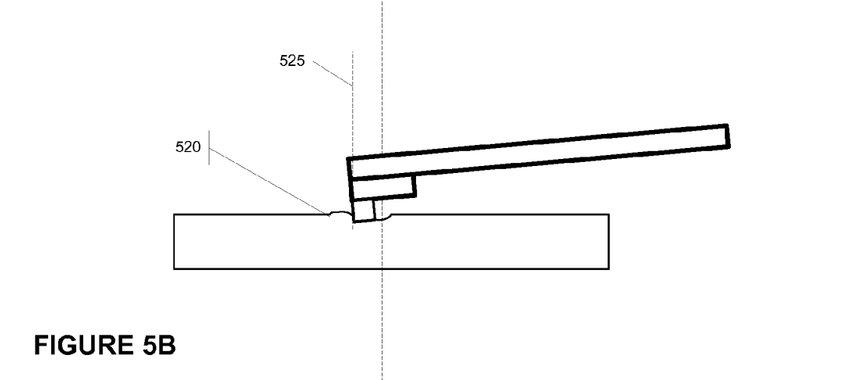
Figure 5C:
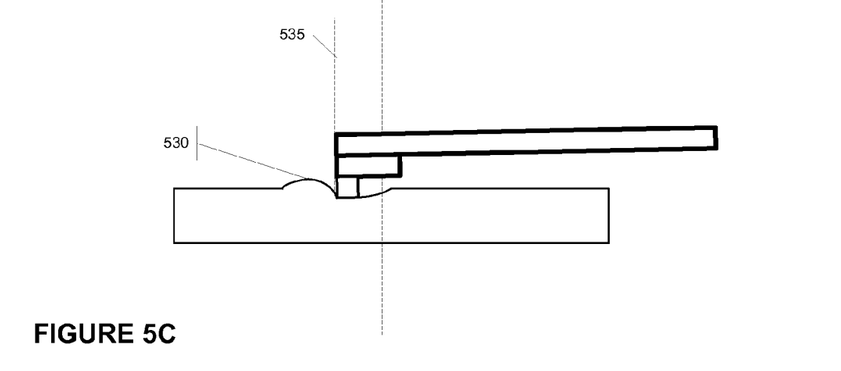

FIGS. 5A-5C illustrate a probe making a touchdown on a DUT contact pad. In FIG. 5A, the probe tip (505) makes contact with the DUT contact pad (510). Dashed line 515 is included to mark the position where the probe tip (505) makes first contact with the DUT contact pad (510). As the probe tip is brought closer to the contact pad, as shown in FIG. 5B, the probe tip begins to dig into the contact pad and pushes material (like a snow plow pushes snow) to form a small mound (520). Not only is the probe tip moving down towards the contact pad, but it also moves laterally as shown by dashed line 525, which represents the location of the probe tip. In FIG. 5C, the probe tip is brought even closer to the contact pad, thereby moving more material (530). Again, the probe tip moves laterally to the position indicated by dashed line 535. The distance the probe tip travels from position 515 to 535 can be seen as the scrub mark on the contact pad.

Figure 6A:
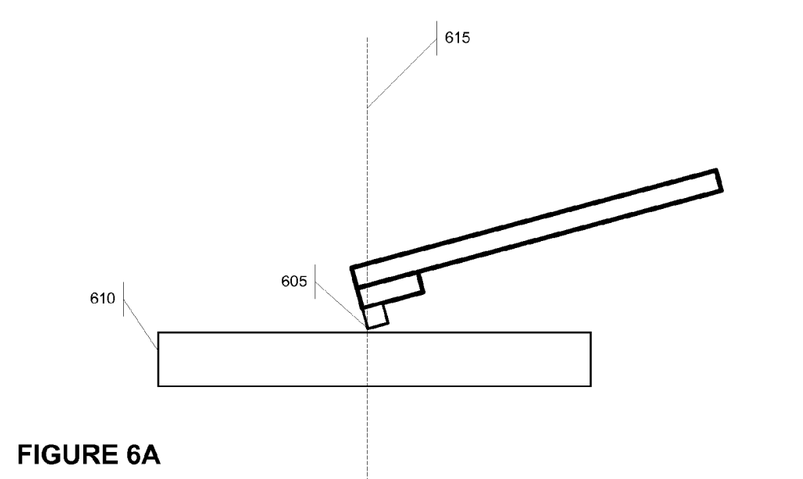
FIGS. 6A-6C are cross-sectional views of a probe as it engages the contact pad of a DUT.
Figure 6B:
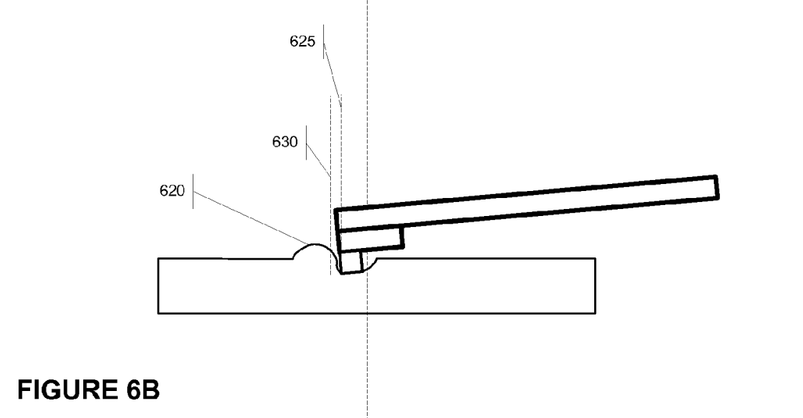
Figure 6C:
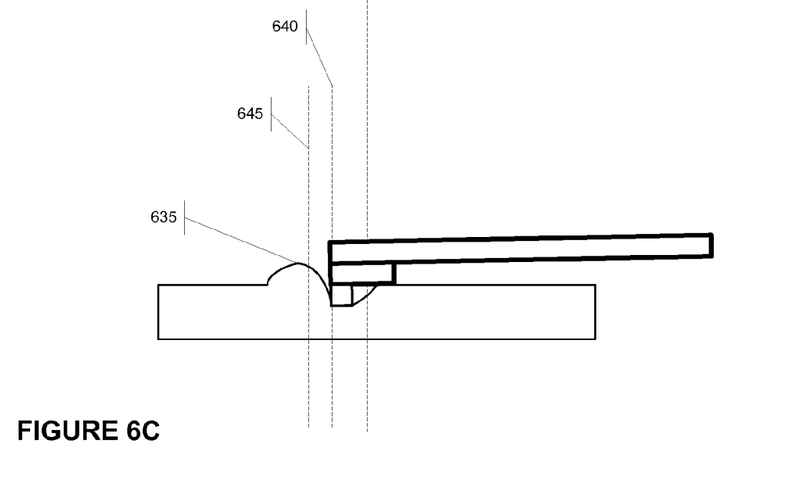

FIGS. 6A-6C also illustrate a probe making a touchdown on a DUT contact pad; however, the amount of lateral force exerted by the probe is larger than the lateral force exerted by the probe just illustrated in FIGS. 5A-5C. In FIG. 6A, the probe tip (605) makes first contact with the DUT contact pad (610), with dashed line 615 marking the start position of the probe tip on the DUT contact pad (610). In FIG. 6B the probe tip is brought closer to the contact pad, and it begins to dig into the contact pad and forms a mound (620). Because the probe exerts a larger lateral force on the DUT contact than in the previous example, the probe tip is able to dig deeper into the contact pad and push more material out of the way. Since the probe is digging deeper, it will not travel as far laterally. Dashed line 625 marks the location of the probe tip. Dashed line 630 marks the location of the probe tip if the probe were to exert a smaller lateral force as in FIG. 5B, and is included to illustrate the difference in the scrub length attributed to the lateral force. Finally, in FIG. 6C the probe is brought even closer to the contact pad, causing the probe tip to dig out even more material (635), bringing the probe tip to the location indicated by dashed line 640. Again, dashed line 645 from FIG. 5C is included to illustrate the difference in the scrub length.

FIGS. 5A-6C demonstrate that a larger lateral force at the probe tip will create shorter scrub lengths in the direction of that lateral force. Therefore, within a DUT, the scrub lengths will not achieve the desirable uniformity sought by the DUT manufacturers.

Figure 7:
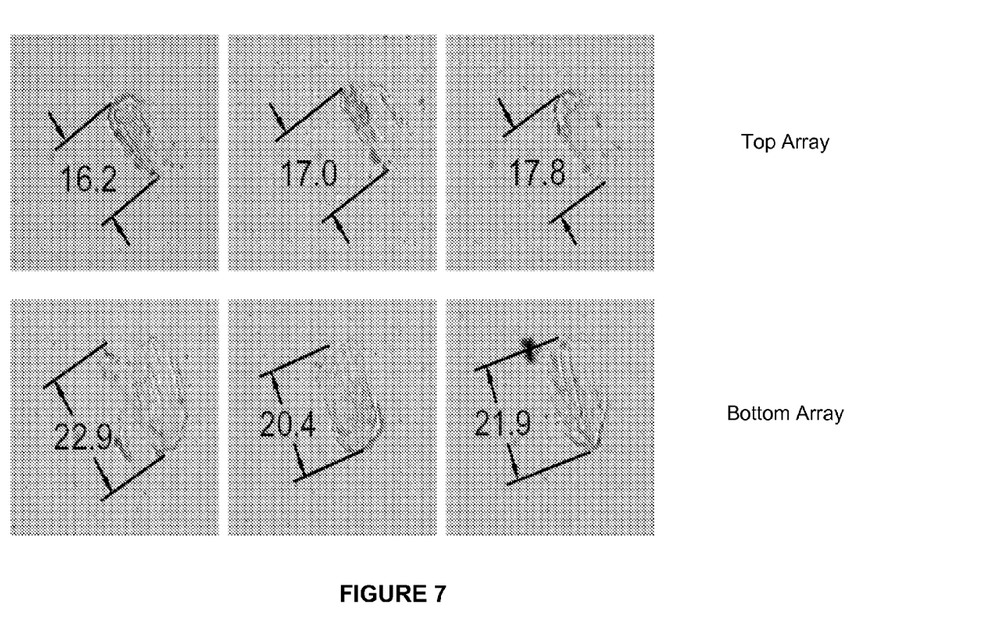
FIG. 7 presents photographs of the scrub marks left by a probe on the contact pad of a DUT.

The variation in scrub lengths is confirmed by the photographs presented in FIG. 7 which depict the scrub marks from a single DUT wafer. Within each single die probe area, the top array of probes has thirty probes while the bottom array has twenty-four probes, resulting in a net lateral force from the top array. The probe card used opposing probe tips to counteract the lateral force—i.e., the probes in the top array faced the opposite direction of the probes in the bottom array. The measured scrub marks for this DUT are presented in Table 1.

TABLE 1

|  | Touchdown 1 | Touchdown 2 |
| --- | --- | --- |
| Average for Top Array (μm) | 17.0 | 19.6 |
| Average for Bottom Array (μm) | 21.7 | 24.8 |
| Averae Difference (μm) | 4.7 | 5.2 |

Figure 8:
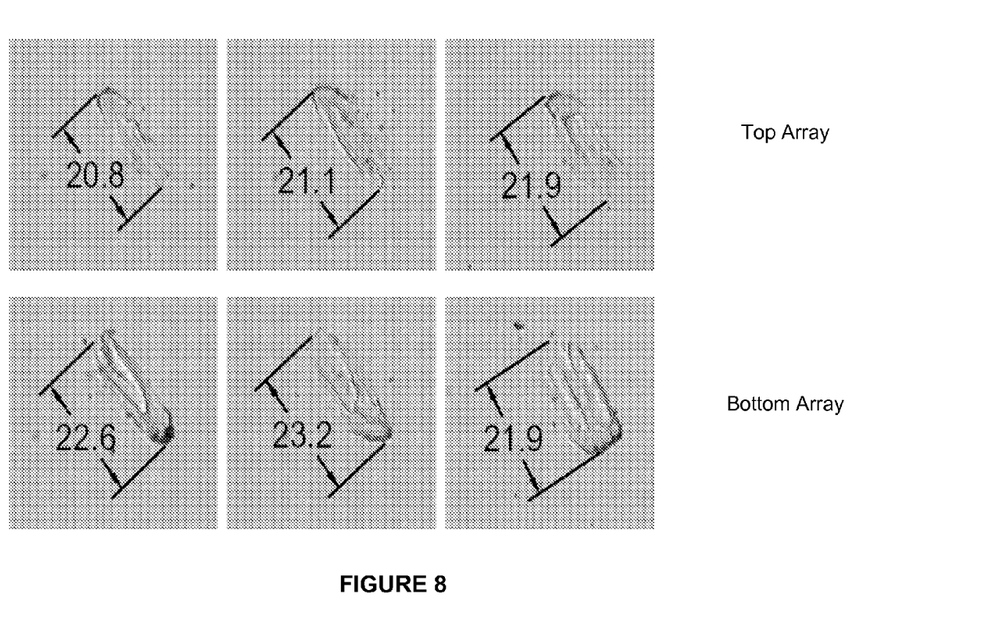
FIG. 8 presents photographs of the scrub marks left by a probe on the contact pad of a DUT.

FIG. 8 also presents photographs of the scrub marks from a single DUT wafer probed with a probe card in the same configuration as the one discussed immediately above (i.e., top array of probes has thirty probes while the bottom array has twenty-four probes). The probe card used in this case implemented two counter measures to address lateral force—(1) the probes in the top array faced the opposite direction of the probes in the bottom array as in example discussed immediately above, and (2) the DUT and probe card were made more rigid to withstand the lateral forces. The measured scrub marks for this DUT are presented in Table 2.

TABLE 2

|  | Touchdown 1 | Touchdown 2 |
| --- | --- | --- |
| Average for Top Array (μm) | 21.3 | 23.0 |
| Average for Bottom Array (μm) | 22.6 | 23.7 |
| Averae Difference (μm) | 1.3 | 0.7 |

Tables 1 and 2 confirm that the lateral force can have a significant impact on the scrub length. These tables also confirm that the scrub lengths in the direction of the lateral force are generally shorter than those in the opposition direction. Thus, to increase the uniformity of the scrub lengths and to reduce stresses on the DUT, the net lateral force should be zeroed or near zeroed.

To attain a zero net force, one or both of the following methods can be implemented. First, the magnitude of the lateral force of the individual probes can be varied by selecting an appropriate probe structure. And second, the orientation of the lateral force may be varied. These two methods can be used independently, or in combination with each other.

Figure 9A:
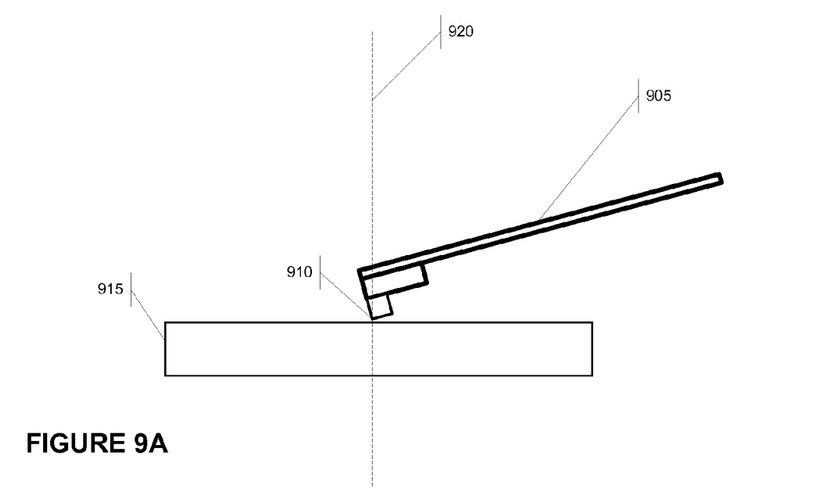
FIGS. 9A-9C are cross-sectional views of a probe with a flexible probe spring element as it engages the contact pad of a DUT.
Figure 9B:
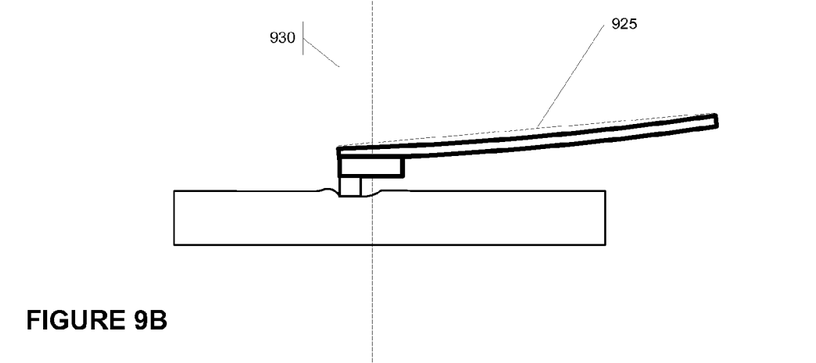
Figure 9C:
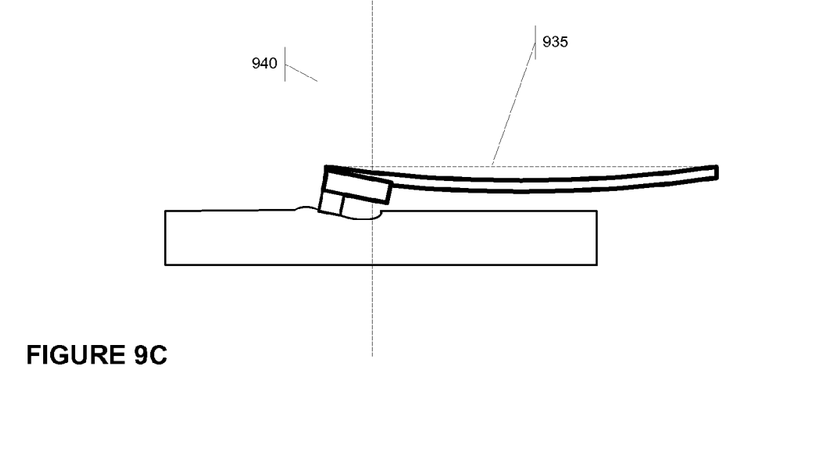

Varying the lateral force through proper structure selection of the individual probe is illustrated in FIGS. 9A-9C. The probe spring element (905) may be constructed to be thinner, which would cause it to bend more easily and exert less force on the DUT contact pad (915). The probe tip (910) comes into contact with the DUT contact pad (915) at the location indicated by dashed line 920. As the probe is brought closer to the contact pad, the spring element begins to flex (as indicated by dashed line 925, illustrating a cord across the spring element) and the probe tip travels to the position indicated by dashed line 930. Because the probe spring element flexes, the probe tip exerts less of a force on the contact pad and, consequently, does not dig into the contact pad as would a probe with a stiffer spring element; thus the probe tip travels more in the lateral direction, causing a longer, more shallow scrub mark. In FIG. 9C, the probe is brought even closer to the contact pad and the probe spring element flexes farther (dashed line 935) and the probe tip travels farther in the lateral direction (see dashed line 940). In the case of torsional probe contactors, a thinner probe spring element would also cause it to bend (or torque) more easily and exert less force on the DUT contact pad.

Figure 10A:
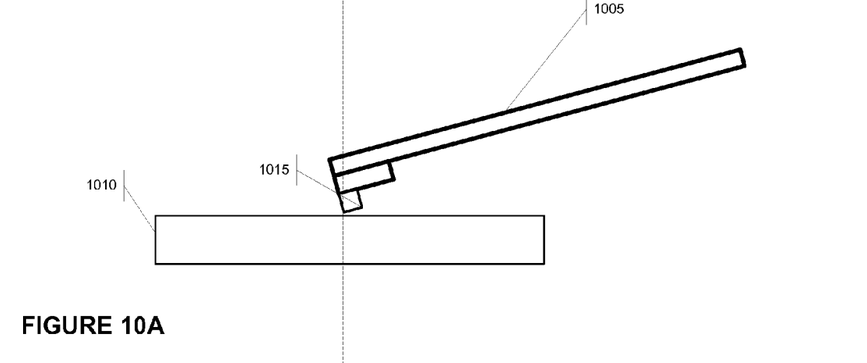
FIGS. 10A-10C are cross-sectional views of a probe with a flexible probe spring element as it engages the contact pad of a DUT.
Figure 10B:
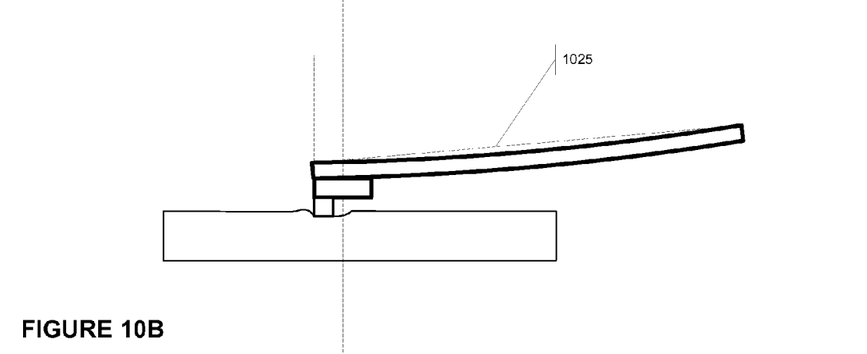
Figure 10C:
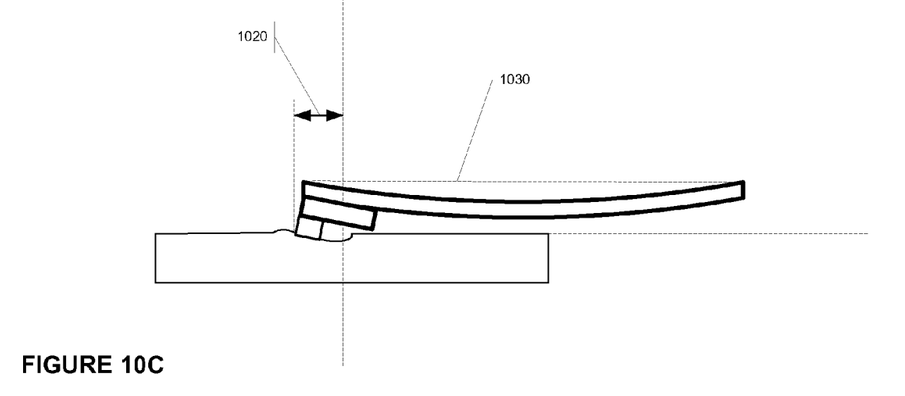

FIGS. 10A-10C illustrates yet another way of varying the structure, and thus the lateral force, of the individual probes. The probe spring element (1005) may be constructed to be longer, which would allow it to bend more easily (see dashed lines 1025 and 1030) and exert less force on the DUT contact pad (1010). Just as in FIGS. 9A-9C, discussed immediately above, the flexible spring element (1005) exerts less force, causing the probe tip (1015) to dig less deeply into the contact pad and allowing the probe tip (1015) to travel farther in the lateral direction (see arrow 1020). In the case of torsional probe contactors, a longer probe spring element would also cause it to bend (or torque) more easily and exert less force on the DUT contact pad.

Figure 11A:
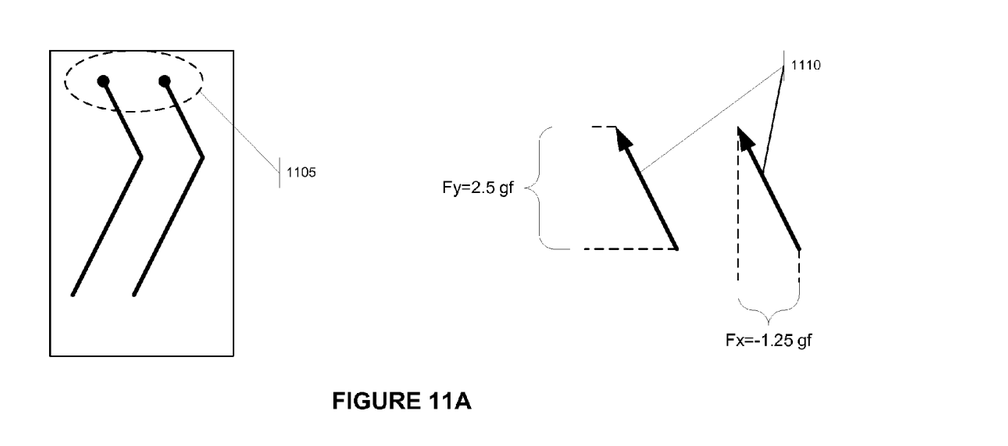
FIGS. 11A-11C are plan views of various individual probes, illustrating how the lateral force may be zeroed by altering the direction of the probes.
Figure 11B:
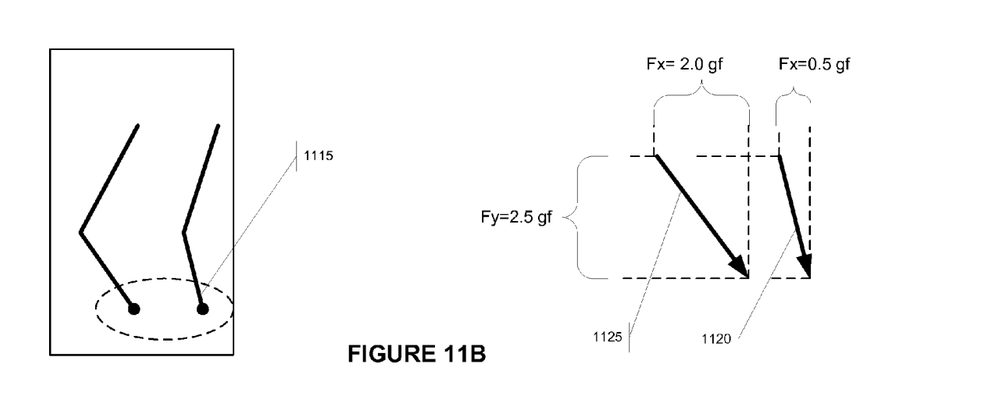
Figure 11C:
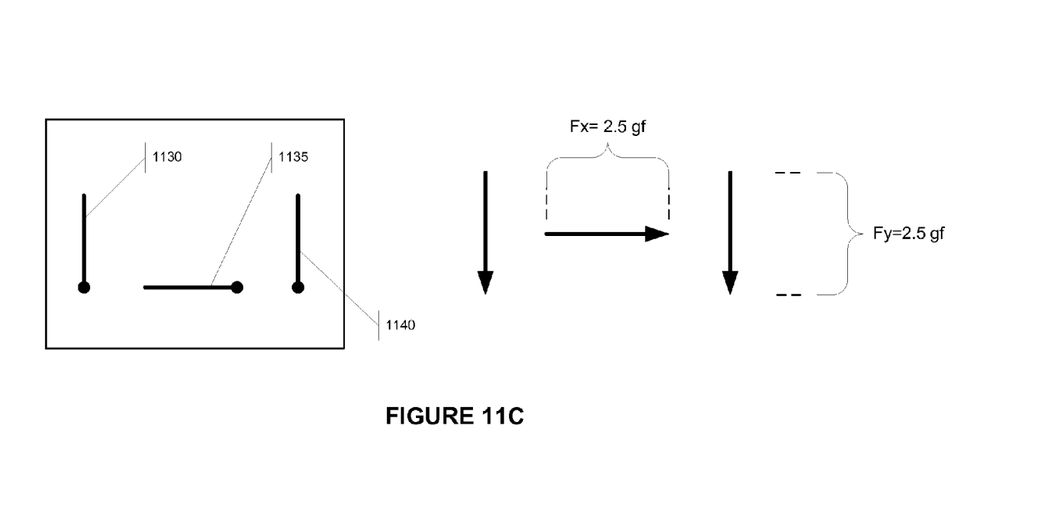

Varying the orientation of the individual probes (which varies the direction of the lateral force) is illustrated in FIGS. 11A-11C. FIG. 11A presents a particular die that consists of a top array of probes (1105), each of which has a direction and magnitude shown by vectors 1110. These vectors each have a Y-component of 2.5 gf, and each have an X-component of −1.25 gf. Vectors 1110 can be balanced by any number of probes which have an equal magnitude Y-component (i.e., 5.0 gf) and an equal magnitude X-component (i.e., 2.5 gf), but in the opposite direction. FIG. 11B presents a bottom array of probes (1115) in a particular configuration that can balance the top array (1105). Specifically, the individual probes of the bottom array (1115), have a lateral force in the direction and magnitude shown by vectors 1120 and 1125. Vector 1120 has an X-component of 0.5 gf and a Y-component of −2.5 gf. Vector 1125 has an X-component of 2.0 gf and a Y-component of −2.5 gf. Since these force components precisely balance the force components of the top array (1105), the die will have a net lateral force that is zero. FIG. 11C illustrates yet another probe configuration that can be used to balance the lateral force exerted by the top array (1105). Probes 1130 and 1140 are oriented along the Y-axis and each exerts a force of −2.5 gf. Because they are parallel to the Y-axis, they have no X-component. Probe 1125 is oriented along the X-axis and exerts a force of 2.5 gf. Again, because the force components of probes (1130, 1135 and 1140) precisely balance the force components of the top array (1105), the die will have a zero net lateral force.

Figure 12A:
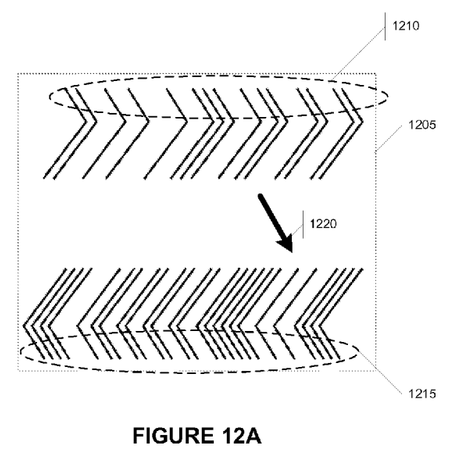
FIGS. 12A-12D are plan views of various individual probe configurations within a single die probe area that zero the lateral force within the single die probe area.
Figure 12B:
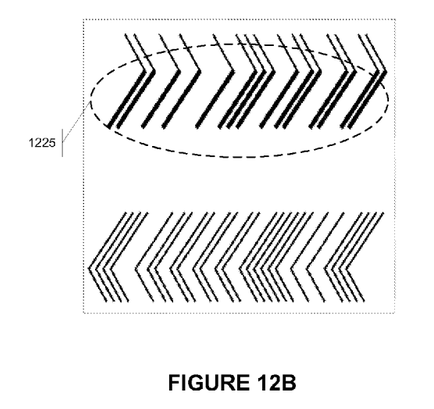
Figure 12C:
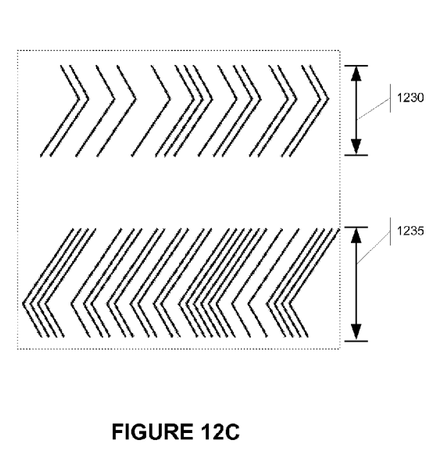
Figure 12D:
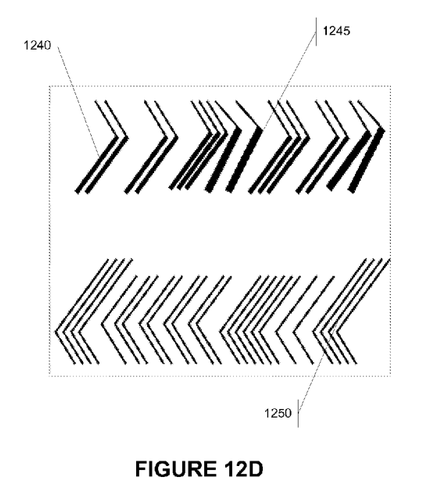

FIGS. 12A-12D illustrate how to implement probes with variable stiffness and variable orientations to achieve a net lateral force of zero or near zero. FIG. 12A is a single die probe area (1205) consisting of fifteen probes in the top array (1210) and twenty-five probes in the bottom array (1215). Because of the uneven probe distribution, a net lateral force in the direction of arrow 1220 is exerted on the DUT. FIG. 12B presents a solution to balance the lateral force, resulting in a net force of zero. Each of the probes in the upper row is made stiffer (1225); thus, they individually exert a larger lateral force on the DUT. Stiffening the probe may be accomplished by a number of techniques including thickening the spring element or shortening the spring element. If each top probe is stiffened to exert a force that is 66% larger than the bottom probes then the net force will be zero. Alternatively, the top probes can be constructed such that they are not of uniform stiffness, provided that the lateral force exerted by the top probes as a whole balances the bottom probes as a whole. In FIG. 12C, the lateral force is balanced by softening the bottom probes such that they exert a smaller lateral force than the individual probes of the top array. This can be achieved by a number of techniques including thinning the probe spring element or by extending the length of the probe spring element. FIG. 12C implements the latter and extends the spring element to soften the individual probes. The length of the top probes (see arrow 1230) is clearly shorter than those of the bottom probes (see arrow 1235). Finally, FIG. 12D uses a combination of stiffening and softening elements, and changing probe orientation to balance the lateral force. For example, some of the top probes are stiffened (1240), while some are stiffened and oriented in a different direction (1245). Some of the bottom probes are softened by extending the spring element (1250). It would be apparent to one skilled in the art that stiffening, softening and orientation can be used in various combinations to attain a net lateral force that is zero or near zero.

While the probe configurations discussed herein have used for illustration purposes a top array and a bottom array, it would be apparent to one skilled in the art that the methods and structures described herein could be applied to a probe configuration with any distribution, whether that distribution is even or not. For example, the configuration may include a top array, a bottom array, a left array and a right array. Or the configuration may be comprised of several probes placed in seemingly random positions. Regardless of the configuration the basic method remains the same—zeroing the X force component and the Y-force component of the various probes such that the probe card exerts no net lateral force. And this zeroing can be accomplished by manipulating the stiffness, softness and orientation of the various individual probes.

The benefit of zeroing the net force within the single die probe area is that the net force for the entire probe card, which often consists of several identical single die probe areas, will also be zero. This allows the probe card to be scaled up to accommodate any number of die because the net lateral force will always be zero.

Figure 13:
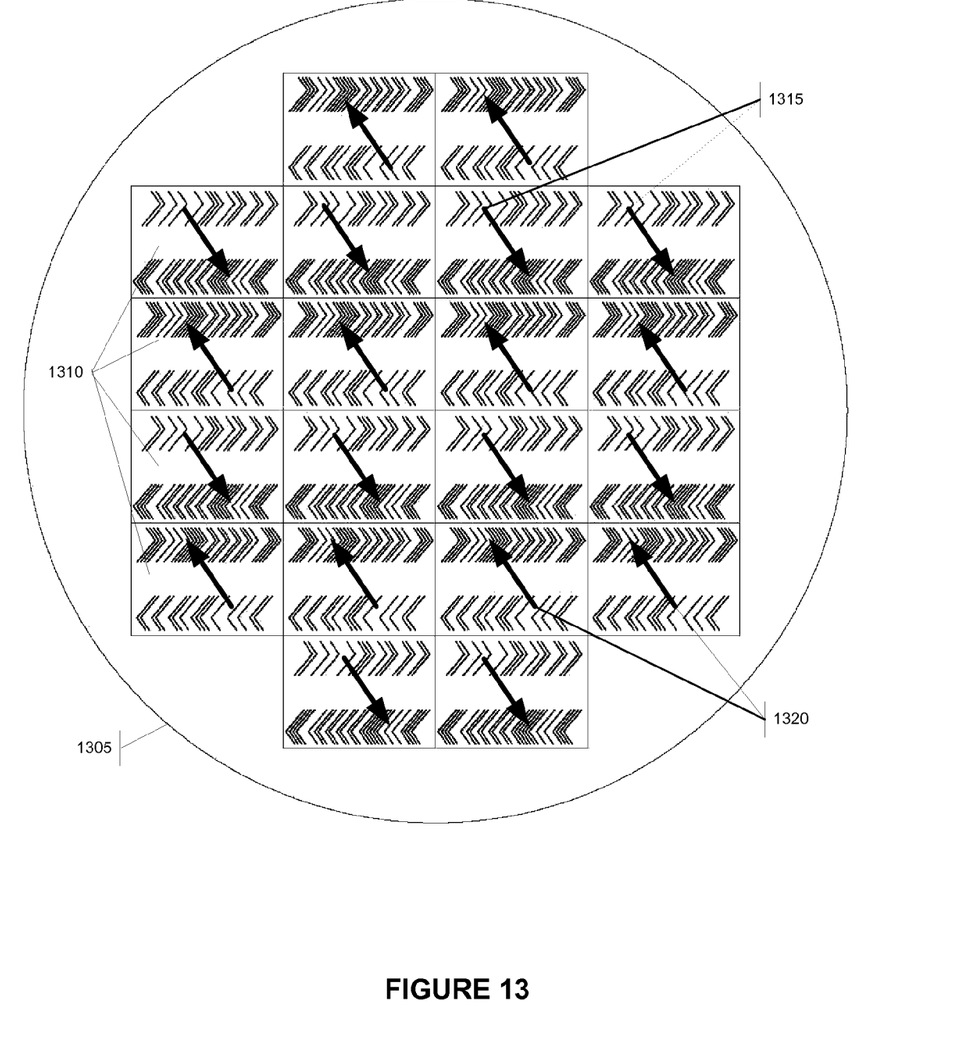
FIG. 13 is a plan view of a probe card with twenty single die probe areas and the lateral force exerted from each single die area.

While it may be advantageous to generate a net zero force within a single die area, it would be apparent to one in the art, that the techniques described herein can be used to generate a net zero lateral force across the entire probe card while the single die probe areas may not be zero. Referring to FIG. 13, a probe card (1305) is depicted with twenty single die probe areas (1310). Some of the single die probe areas have a net lateral vector in the direction of arrow (1315), with the others in the direction of arrow (1320). The net effect of these lateral forces, however, is that they balance each other resulting in a net lateral force over the entire probe card of zero.

Having described the methods and structures in detail and by reference to several preferred embodiments thereof, it will be apparent that modifications and variations are possible without departing from the scope of the invention defined in the following claims. Moreover, the applicants expressly do not intend that the following claims "and the embodiments in the specification to be strictly coextensive." *Phillips v. AHW Corp.*, 415 F.3d 1303, 1323 (Fed. Cir. 2005) (en banc).

The invention claimed is:

1. A probe card comprising:

At least two identical single die probe areas;

a plurality of individual probes within one of the single die probe areas;
   wherein the structure and orientation for each of the individual probes within the plurality achieve substantially no net lateral force exerted by the plurality during touchdown; and
a plurality of individual probes within a second of the single die probe areas;
   wherein the structure and orientation for each of the individual probes within the plurality achieve substantially no net lateral force exerted by the plurality during touchdown.

2. The probe card of claim 1, further comprising at least five identical single die probe areas and wherein the net lateral force exerted by the at least four areas is substantially zero during touchdown.

3. A probe card comprising:
a plurality of identical single die probe areas, each of which is comprised of a top array of probes and a bottom array of probes, wherein the number of probes in the top array is not equal to the number of probes in the bottom array; and
the top array and bottom array further comprise individual probes whose structure and orientation achieve substantially no net lateral force exerted by the top and bottom arrays during touchdown.

4. The probe card of claim 3, wherein the plurality of identical single die probe areas further comprises at least four single die probe areas and wherein the net lateral force exerted by the at least four areas is substantially zero during touchdown.

5. The probe card of claim 1, wherein the structure of an individual probe of the plurality is stiffened to increase the amount of lateral force exerted by the individual probe during touchdown.

6. The method of claim 1, wherein the structure of an individual probe of the plurality is softened to decrease the amount of lateral force exerted by the individual probe during touchdown.

7. The probe card of claim 3, wherein the structure of an individual probe of the top array is stiffened to increase the amount of lateral force exerted by the individual probe during touchdown.

8. The probe card of claim 3, wherein the structure of an individual probe of the bottom array is stiffened to increase the amount of lateral force exerted by the individual probe during touchdown.

9. The method of claim 3, wherein the structure of an individual probe of the top array is softened to decrease the amount of lateral force exerted by the individual probe during touchdown.

10. The method of claim 3, wherein the structure of an individual probe of the bottom array is softened to decrease the amount of lateral force exerted by the individual probe during touchdown.

* * * * *